US 6,621,730 B1

United States Patent
Lage

(10) Patent No.: US 6,621,730 B1
(45) Date of Patent: Sep. 16, 2003

(54) MAGNETIC RANDOM ACCESS MEMORY HAVING A VERTICAL WRITE LINE

(75) Inventor: Craig S. Lage, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/228,684

(22) Filed: Aug. 27, 2002

(51) Int. Cl.[7] .................. G11C 11/00; G11C 11/14; G11C 11/15
(52) U.S. Cl. ..................................... 365/158
(58) Field of Search ............... 365/158, 171, 365/173

(56) References Cited

U.S. PATENT DOCUMENTS

| | | | |
|---|---|---|---|
| 5,389,566 A | | 2/1995 | Lage ........................... 437/52 |
| 6,163,477 A | * | 12/2000 | Tran ........................... 365/171 |
| 6,166,948 A | * | 12/2000 | Parkin et al. ................. 365/173 |
| 6,252,796 B1 | * | 6/2001 | Lenssen et al. .............. 365/171 |
| 6,404,672 B2 | * | 6/2002 | Sato et al. ................... 365/173 |
| 6,510,080 B1 | * | 1/2003 | Farrar ......................... 365/171 |
| 6,529,404 B2 | * | 3/2003 | Hidaka ........................ 365/171 |
| 6,552,926 B2 | * | 4/2003 | Komori ....................... 365/158 |

* cited by examiner

*Primary Examiner*—Trong Phan
(74) *Attorney, Agent, or Firm*—Kim-Marie Vo; David G. Dolezal

(57) ABSTRACT

A magnetic random access memory (MRAM) device is formed having a fixed magnetic layer, a free magnetic layer and a first dielectric layer between them in a recess. A metal plug and an optional second dielectric layer are also formed in the recess. The metal plug serves as a write path. A word line in the MRAM cell is the gate electrode of a transistor used to both write and read the MRAM device. To write the device a current travels in a substantially vertical direction and therefore only affects one MRAM cell, thereby not affecting adjacent cells. Data storage is thereby improved.

32 Claims, 4 Drawing Sheets

MAGNETIC RANDOM ACCESS MEMORY HAVING A VERTICAL WRITE LINE

FIELD OF THE INVENTION

The present invention relates generally to semiconductor devices and more particularly to a magnetic random access memory (MRAM) device.

RELATED ART

Magnetic random access memory (MRAM) technology development is currently underway for use as a type of non-volatile memory (NVM) by the semiconductor industry. MRAM may also prove useful as dynamic random access memory (DRAM) or static random access memory (SRAM) replacements. There are two main types of MRAM: MTJ (magnetic tunnel junction) and GMR (giant magnetoresistive) MRAM. An MRAM array includes a write line or a bit line intersected by a number of digit lines. At each intersecting write line and digit line, a magnetic tunnel junction sandwich forms a memory element or bitcell in which one "bit" of information is stored. The magnetic tunnel junction sandwich is comprised of a thin insulating material between a magnetic layer of fixed magnetization vector and a magnetic layer in which the magnetization vector can be switched; these will be referred to as a fixed magnetic layer and a free (or switching) magnetic layer, respectively.

One problem with MRAM occurs when writing data to a single magnetic tunnel junction sandwich. Since the write line current travels through a plurality of MRAM bitcells, in order to apply enough current to write a selected MRAM bitcell at the intersection of the write line and digit line, adjacent MRAM bitcells are accidentally written, which may cause incorrect data storage. Therefore, a need exists to controllably write a single MRAM bitcell without accidentally writing adjacent MRAM bitcells.

BRIEF DESCRIPTION OF THE FIGURES

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Figure 1:
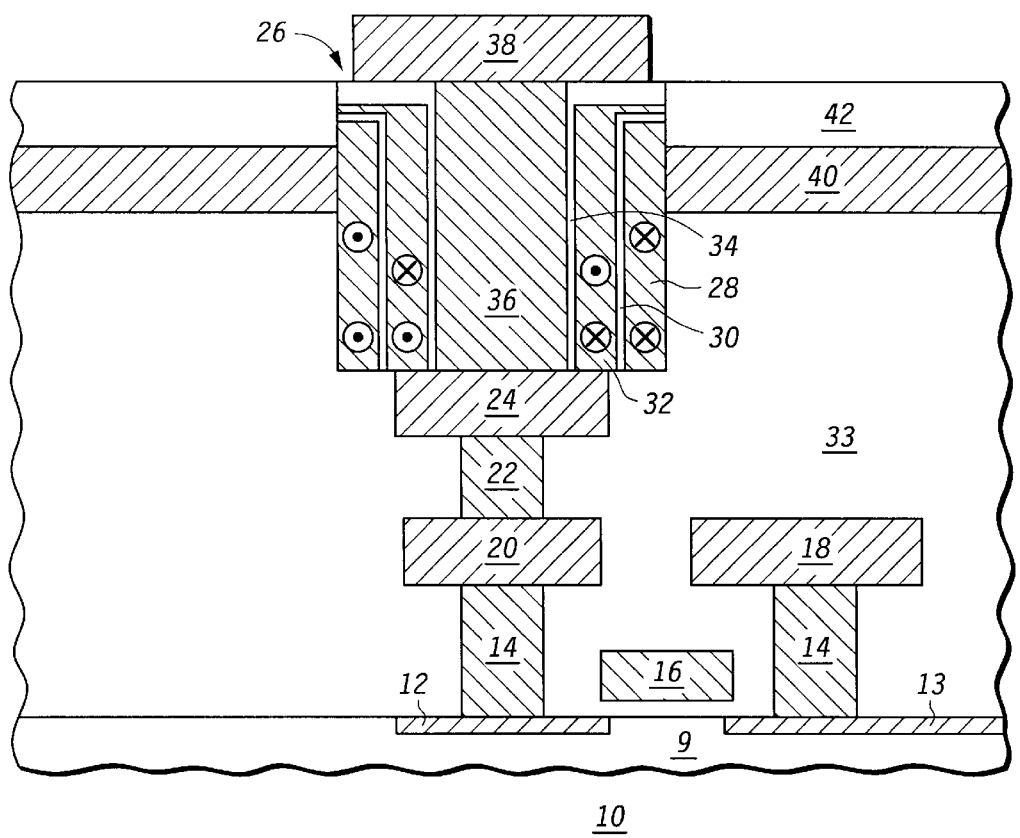
FIG. 1 illustrates a cross-sectional conceptual view of an MRAM device in accordance with an embodiment of the present invention.

FIG. 1 illustrates a cross-section view of an MRAM device 10 which includes a mono-crystalline layer 9 (or other suitable layer, such as silicon on insulator (SOI) or the like), doped regions 12 and 13, first vias 14, word line 16, a first conductive pad or structure 20, a second via 22, a second conductive pad or structure 24, a virtual ground line (a ground structure) 18, an MRAM sandwich 26 and a bit line 40. A first dielectric layer 33 and a second dielectric layer 42 isolate conductive regions from each other, such as isolating the first conductive layer 20 from the virtual ground line 18. The word line 16 is a gate electrode of a transistor that includes portions of the doped regions 12 and 13, which serve as source and drain regions, and a portion of the first dielectric layer 33 that serves as a gate oxide. In accordance with one non-limiting embodiment, the mono-crystalline substrate 9 is a P-type silicon substrate and the word line transistor is an NMOS transistor. Other circuit elements, for example, input/output circuitry, data/address decoders, and comparators, may be contained in the MRAM device 10, however they are omitted from the drawings for simplicity.

The MRAM sandwich 26 includes a fixed magnetic layer 28 and a free magnetic layer 32 separated by a third dielectric layer 30, an optional fourth dielectric layer 34, and a metal plug 36. Although not shown in FIG. 1 due to the limitations of a two dimensional drawing, the fixed magnetic layer 28 surrounds all sides of a recess it is within, forming in one embodiment a toroid or cylinder of magnetic material. Therefore, the two portions of the fixed magnetic layer 28 that are shown are connected to each other and are part of the whole fixed magnetic layer 28. The fixed magnetic layer 28 is a fixed magnetic layer as illustrated by the "X"'s in the circles of the fixed magnetic layer 28 and the dots within circles. As is common notation for magnets, the "X"'s in the circles mean that the magnetic field is traveling into the page or away from the reader (i.e., as if a person is looking at an arrow from the tail and the "X" illustrates the feathers at the end of an arrow) and the dots within circles means that the magnetic field is traveling out of the page or towards the reader (i.e., as if a person is looking at the tip of an arrow.) Thus, the magnetic field of the fixed magnetic layer 28 in the embodiment of FIG. 1, travels in a horizontal circular direction that is counterclockwise. However, the magnetic field of the fixed magnetic layer 28 can alternately travel in a clockwise direction. It is important though that the fixed magnetic layer 28 has a magnetic field that travels in only one direction (i.e., either clockwise or counterclockwise.) In other words, the direction of the magnetic field of the fixed magnetic layer 28 cannot be changed by applying a current.

In contrast, the free magnetic layer 32 has a magnetic field that can travel in either a clockwise or counterclockwise direction as illustrated by both portions of the free magnetic layer 32 having an "X" in a circle and a dot within a circle. However, the magnetic field only travels in one direction until a current is applied that changes the direction. For example, if the magnetic field is traveling counterclockwise in a horizontal plane, a current can be applied to switch the direction of the magnetic field so that it is traveling in a clockwise direction in a horizontal plane.

The free magnetic layer 32, like the fixed magnetic layer 28, is adjacent to all sides of the recess it is within, forming in one embodiment a toroid or cylinder of magnetic material. Therefore only two portions, which are connected to each other, are shown in FIG. 1. The free magnetic layer 32 and the fixed magnetic layer 28, which are both conductive magnetic materials, are electrically isolated from each other by the third dielectric 30 so that when a current is applied to the free magnetic layer 32 it does not also affect the fixed magnetic layer 28. Similarly, the optional fourth dielectric 34 can electrically isolate the free magnetic layer 32 from the metal plug 36, which is the write current line or write path structure, during a write operation. However, the optional fourth dielectric 34 may not be needed depending on the materials used for the metal plug 36 and the free magnetic layer 32. For example, if the metal plug 36 is copper and the free magnetic layer is an iron alloy, such as NiFe, since copper is significantly more conductive than iron alloys, it is unlikely that a significant amount of current will be transmitted from the copper layer to the free magnetic layer and thus an insulating layer between them (i.e., the optional fourth dielectric 34) is not needed for the write operation.

As shown in FIG. 1, the free magnetic layer 32, the fixed magnetic layer 28, the third dielectric 30, the optional fourth dielectric 34 and the metal plug 36 are all located within the recess. The free magnetic layer 32 surrounds at least a portion of the metal plug 32, the third dielectric layer 30 surrounds at least a portion of the free magnetic layer 32, and the fixed magnetic layer 28 surrounds at least a portion of the third dielectric layer 30. If present, the optional fourth dielectric layer 34 surrounds at least a portion of the metal plug 36 and the free magnetic layer 32 surrounds a portion of the optional fourth dielectric 34.

In one embodiment, a digit line is located over the MRAM sandwich 26, which is within the recess. Furthermore, the bit line 40 forms at least a portion of sidewalls of the recess and, therefore, is coupled to the fixed magnetic layer 28, which is adjacent the sidewall of the recess.

During a write operation the digit line 38 and the bit lines 40 are set to high, the virtual ground line 18 is set to low, and the word line is set to high. The write current travels from the digit line 38 through the metal plug 36 to the transistor within the word line 16 or vice versa. The word line 16 is coupled to the gate electrode (control terminal) and in the preferred embodiment is the gate electrode. Therefore, the word line 16 controls the conductivity of the transistor. During the write operation, the transistor has a terminal, which is the doped region 12 that is made conductive by a voltage to individually enable the flow of a current through the metal plug 36. Therefore, the current when writing travels in a substantially vertical direction. In other words, the metal plug 36 is positioned with respect to the free magnetic layer 32 to provide a current path having a vertical component.

The direction chosen for the write process changes the polarity (direction) of the magnetic field in the free magnetic layer 32, while the direction of the magnetic field in the fixed magnetic layer 28 remains unchanged. The polarity of the magnetic field in the free magnetic layer 32 is either parallel to or antiparallel to the polarity of the magnetic field of the fixed magnetic layer 32. In other words, if the polarity of the magnetic field of the fixed magnetic layer 32 and the free magnetic layer are counterclockwise, the polarities of the magnetic fields for the layers are parallel to each other (i.e., the spin of the electrons in both layers are the same (parallel to each other) so that the magnetic fields of each of the layers are in the same direction as each other.) However, if the polarity of the magnetic field of the fixed magnetic layer 32 is counterclockwise and that of the free magnetic layer 28 is clockwise, the polarities of the magnetic fields for the layers are antiparallel to each other (i.e., the spin of the electrons in both layers are not the same as each other and therefore are antiparallel to each other so that the magnetic fields of each of the layers are in opposite directions.)

In order to read the MRAM device 26, the polarity of the magnetic fields of the free magnetic layer 28 respective to the fixed magnetic layer 32 is sensed. In other words, it is determined if the polarities of the layers are parallel or antiparallel. If the polarities of the magnetic fields of the fixed magnetic layer 28 and the free magnetic layer 32 are parallel to each other, it is easier for electrons to tunnel through the MRAM sandwich 26 than if the polarities of each layer are antiparallel. Hence, a greater discharge rate is sensed if the polarities of the fixed magnetic layer 28 and the free magnetic layer 32 are parallel to each other as opposed to being antiparallel to each other. Moreover, the resistance between the fixed magnetic layer 28 and the free magnetic layer 32 is indicative of a value stored in the MRAM sandwich 26. To sense the MRAM device 26, the virtual ground line 18 is set to low, the digit line 38 and the word line 16 are set to high, and a discharge rate is sensed on the bit line 40. As shown in FIG. 1, the read current travels from the transistor in the word line 16 through the MRAM sandwich 26 to the bit line 40, where the discharge rate is sensed. The doped region 13 (a terminal) of the transistor is coupled to the virtual ground line 18 and is made conductive via a voltage to enable the flow of current between the metal plug 36 and the virtual ground line 18 during a read operation. Therefore, the transistor within the word line 16 is used for both the read and write operations.

Figure 2:
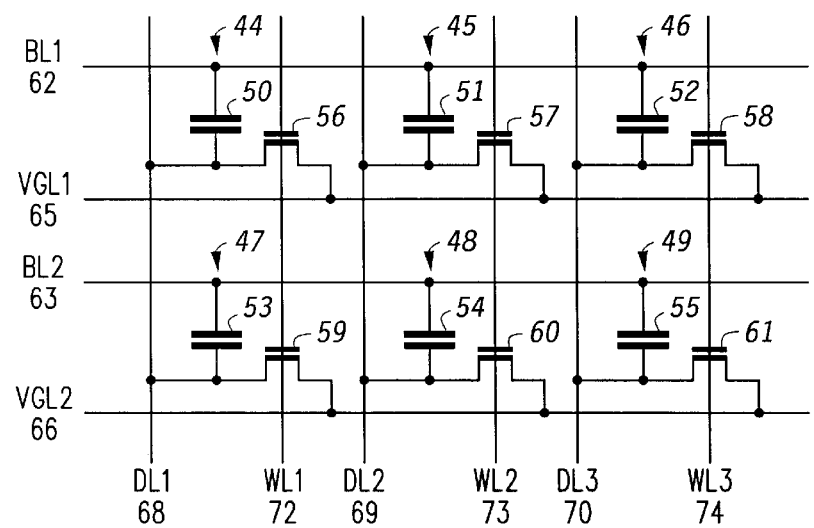
FIG. 2 illustrates a circuit diagram of an MRAM array that includes the MRAM device of FIG. 1.

FIG. 2 illustrates a schematic of an MRAM array 42 which includes a plurality of MRAM cells 44–49. Each MRAM cell 44–49 includes an MRAM sandwich 50–55, which is similar to the MRAM sandwich 26 of FIG. 1, and transistors 56–61. Some of the transistors 56–61 are coupled to each other via a word line (WL) 72–74, which forms the gate electrode for each transistor, or virtual ground lines (VGL) 65–66. For example, the word line (WL1) 72 couples the transistors 56 and 59, the word line (WL2) 73 couples the transistors 57 and 60, and the word line (WL3) 74 couples the transistors 58 and 61. The virtual ground line (VGL1) 65 couples the transistors 56–58 and the virtual ground line (VGL2) 66 couples the transistors 59–61. Similarly some of the MRAM sandwiches 50–55 are coupled to each other by digit lines (DL) 68–70 or bit lines (BL) 62–63. The digit line (DL1) 68 couples the MRAM sandwiches 50 and 53, the digit line (DL2) 69 couples the MRAM sandwiches 51 and 54, and the digit line (DL3) 70 couples the MRAM sandwiches 52 and 55. The bit line (BL1) 62 couples the MRAM sandwiches 50–52, and the bit line (BL2) 63 couples the MRAM sandwiches 53–55. The bit lines 62–63 are perpendicular to the word lines 72–74 and the digit lines 68–70 are perpendicular to the virtual ground lines 65–66.

Generically, during the write operation, the bit lines 62–63, digit lines 68–70, and word lines 72–74 are held low and the virtual ground lines 65–66 are pre-charged high. The digit line that is coupled to the selected MRAM cell to be written is brought high as is the word line that is coupled to the selected MRAM cell. The virtual ground line that is coupled to the selected MRAM cell is set to low. For example, to write the MRAM cell 44, the virtual ground line (VGL1) 65 is set to low, the digit line (DL1) 68 and the word line (WL1) 72 are set to high. All the bit lines 62–63 are set to low because they are not used to write the MRAM cell 44. Furthermore, the digit lines 69–70 and word lines 73–74 are set to low. Also, the virtual ground line (VGL2) 66 is set too high.

As explained above, the selected word line is used to write the MRAM sandwich. The selected ground line applies a current to a first doped region (i.e., source region) of the selected transistor within the selected MRAM cell. The voltage on the selected word line causes the selected transistor to turn on. The MRAM sandwich is coupled to a second doped region (i.e., drain region) of the selected transistor and the selected digit line. The MRAM sandwich is also coupled to a bit line, but it is not used in the write process. Therefore, the current from the selected digit line and the second doped region of the selected transistor is used to write the MRAM sandwich by making the free magnetic layer of the selected MRAM sandwich either parallel or antiparallel to the fixed magnetic layer. Since in the unselected cells the transistors do not turn on because the unselected word lines are set to low, the unselected MRAM sandwiches do not receive a current from the second doped region of the unselected transistors as well as no current from the unselected digit lines that are set to low and thus the polarities of the free magnetic layers of the unselected MRAM sandwiches are desirably not changed. Furthermore, the currents flowing in the selected digit lines and virtual ground lines which are passing over unselected MRAM sandwiches are flowing horizontally, and hence the magnetic fields created by these currents are not in the proper direction to change the magnetization state of the unselected MRAM free magnetic layers. This is in contrast to the conventional planar MRAM cell, where the direction of all writing currents is horizontal, and only the magnitude of the magnetic field, not its direction, distinguishes the selected cell from the unselected cells. This greatly improves the margin between desirably writing the selected cell and undesirably writing the unselected cells.

Generically, during the read operation, all digit lines 68–70, bit lines 62–63 are pre-charged to high. The virtual ground lines 65–66 and the word lines 73–74 are held low. Then the word line that is coupled to the selected MRAM cell is brought high and the bit line coupled to the selected MRAM cell is sensed. To read the MRAM cell 44, for example, the virtual ground line (VGL1) 65 is set to low, the digit line (DL1) 68 is pre-charged high, the word line (WL1) 72 is set to high, and the discharge rate is sensed using the bit line (BL1) 62. All the digit lines 68–70 are set to high because they are not used to read the MRAM cell 44, although it should be noted that digit line (DL1) 68 will be pulled low when the word line (WL1) 72 is set to high. By comparing the discharge rate of bit line 62 to a reference cell, it can be determined if the magnetization state of the free magnetic layer in the MRAM cell 44 is parallel or antiparallel to the magnetization state of the fixed magnetic layer in the MRAM cell 44. This reads the data out of the cell.

Figure 3:
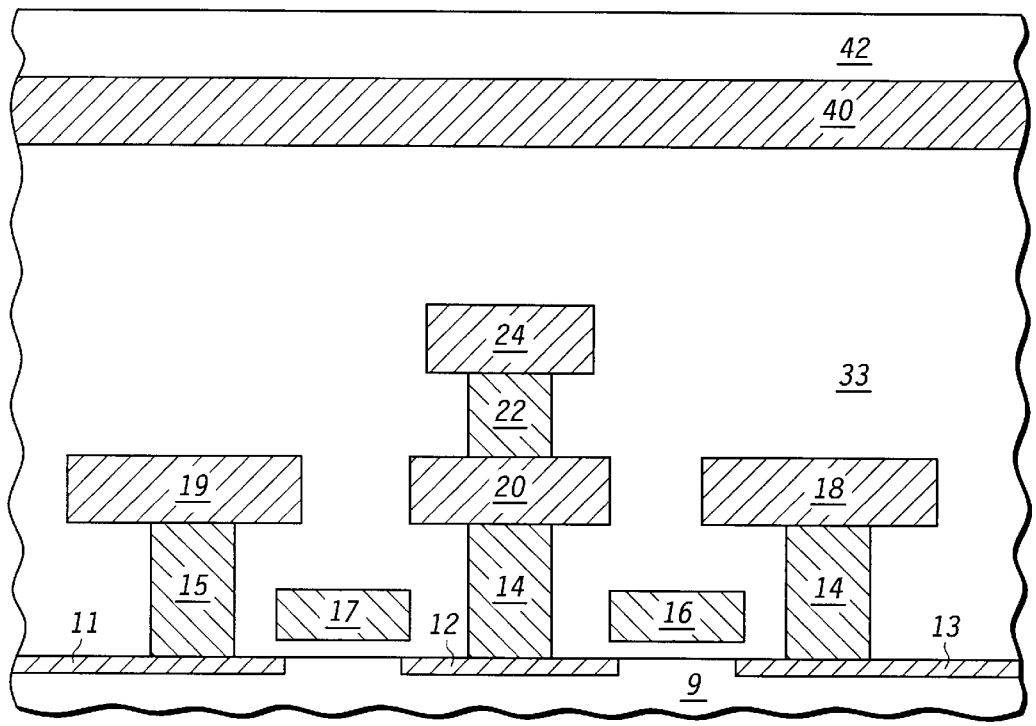
FIGS. 3–8 illustrate cross-sectional views of a process for forming the MRAM device in accordance with an embodiment of the present invention.

In accordance with an embodiment of the present invention, a process for forming an MRAM cell that can be implemented in the schematic shown in FIG. 2 is described with respect to FIGS. 3–8, which also include associated magnetic memory element digit line and bit line circuitry. FIG. 3 illustrates a portion of an MRAM device that has been formed using conventional processes.

Referring to FIG. 3, a cross-sectional view that includes a partially fabricated MRAM device 10 is illustrated. The MRAM device 10 includes a mono-crystalline substrate 9 (or other suitable substrate, such as silicon on insulator (SOI) or the like). Doped regions 11, 12 and 13 are source and drain regions. The doped regions 12 and 13 form the source or drain for the transistor that has a gate electrode formed from the word line 16. This transistor is a portion of the memory cell that the MRAM sandwich that is being formed is part of. A word line 17, however, is associated with an MRAM sandwich that is also being formed, but is not shown in the figures. The source and drain regions for the transistor that has a gate electrode formed from the word line 17 are the doped regions 11 and 12. The doped regions 11 and 12 are formed by ion implantation, in one embodiment.

To begin the transistor fabrication, a dielectric material is deposited so that a dielectric material is over the areas between the doped regions 11 and 12 and the doped regions 12 and 13, which will become the channel regions of transistors. The dielectric material is the gate dielectric and can be silicon dioxide, hafnium oxide, any other dielectric, or combinations thereof.

The gate electrode is then formed by depositing and patterning a material, such as polysilicon, tungsten, tantalum, the like and combinations thereof. Since the gate electrode for the transistors is also the word line, the material is patterned so that a portion of it lies over the gate dielectrics previously formed. The word line should lie over many gate dielectrics as it forms a plurality of gate electrodes for a plurality of transistors in various MRAM cells. Thus, in the embodiment shown in FIG. 3 the word line is patterned to form the structures shown in cross-section, but in three dimensions the word line runs in and out of the paper. After forming the gate electrode, the doped regions 11, 12 and 13, are formed, typically by ion implantation. A first interlevel dielectric (ILD) layer (which is a portion of the first dielectric layer 33) is then formed overlying the substrate surface (Note, when used in this context "substrate surface" includes the semiconductor device substrate as well as all layers fabricated on the semiconductor device substrate up to the point of processing under discussion. Therefore, substrate surface refers to the present uppermost surface of the substrate, including all structures formed thereon). In one embodiment the first ILD layer is a silicon dioxide containing material deposited by chemical vapor deposition (CVD) using tetraethoxysilane (TEOS) as a gas source. Alternatively, the first ILD layer may be a layer of silicon nitride, a layer of phosphosilicate glass (PSG), a layer of borophosphosilicate glass (BPSG), a spin on glass (SOG) layer, a layer of silicon oxynitride (SiON), a polyimide layer, a layer of a low-k dielectric material (for the purposes of this specification a low-k dielectric material or low dielectric constant material is any material having a dielectric constant less than the dielectric constant of silicon dioxide), or the like. Deposition can occur alternatively, by physical vapor deposition (PVD), a combination of PVD and CVD, the like, or combinations thereof.

The vias 14 and 15 are then formed within the first ILD layer and over the doped regions 11 and 12 by etching the first ILD layer and forming a plug fill material or combination of materials. In one embodiment the conductive plugs 14 and 15 comprise an adhesion/barrier layer (not shown) and a plug fill material. The adhesion/barrier layer is typically a refractory metal, such as tungsten (W), titanium (Ti), tantalum (Ta), and the like, a refractory metal nitride, or a combination of refractory metals or their nitrides. The plug fill material is typically tungsten, aluminum, copper, or a like conductive material. The adhesion/barrier layer and plug fill material can be deposited using PVD, CVD, electroplating processes, combinations thereof, or the like. After depositing the adhesion/barrier layer and the plug fill material, the substrate surface is polished to remove portions of the adhesion/barrier layer and plug fill material not contained within the opening to form the vias 14 and 15.

An intralevel dielectric layer (which forms another portion of the first dielectric layer 33) is then deposited over the semiconductor substrate and can be any material used for the first ILD layer. Preferably, the intralevel dielectric layer and the first ILD layer are the same materials. The intralevel dielectric layer is patterned to form recesses and a conductive material is formed within the recess and polished to form the virtual ground line 18, the first metal pad 20 and the virtual ground line 19. The conductive material can be any material or stack of materials used to form the vias 14 and 15. Although the virtual ground line 18 is coupled to an MRAM sandwich not shown in FIGS. 3–8, the virtual ground lines 18 and 19 are coupled to each other, but not to the first metal pad 20, which is isolated from the virtual ground lines 18 and 19. Therefore, in one embodiment, the virtual ground line 19 in three dimensions comes out of the page of FIG. 3 and is located adjacent the first metal pad 20 in a plane not shown and connects to the virtual ground line 18.

Next, a second ILD layer (which forms yet another portion of the first dielectric layer) is deposited and patterned. The second ILD layer preferably is the same material as the first ILD layer and/or the intralevel dielectric layer, but need not be. The second ILD layer is patterned to form the second via 22 and the second metal pad 24 using a dual in-laid approach, such as via first, trench last (VFFL) or trench first, via last (TFVL) processing, or a single in-laid approach, wherein the via is formed first and polished to have a surface coplanar with a second ILD layer and then another dielectric layer is deposited and patterned and the second conductive layer pad 24 is formed. These processes are conventional and known to a skilled artisan. The second vias 22 and the second conductive layer pad 24 are conductive materials and can be any material or combination of materials described for the vias 14 and 15. In a preferred embodiment, the vias 14, 15 and 22 are the same materials and at least the first conductive layer pad 20 and the second conductive layer pad 24 are the same materials.

After forming the second metal pad 24, a dielectric layer, which can be the same material as the first ILD layer, is deposited so that all the ILD and intralevel dielectric layers together form the first dielectric layer 33, which can be formed from a stack of a plurality of the same dielectric material or a variety of dielectric materials.

A conductive material, such as copper, a copper-alloy, aluminum, the like and combinations thereof, is formed by CVD, PVD, the like, and combinations thereof to form the bit line 40. A dielectric layer (not shown in the figures) is formed and patterned to form a pattern or recesses in which the conductive material is deposited to form the bit line 40. Next, a second dielectric layer 42 is deposited over the bit line 40, as shown in FIG. 3. The second dielectric layer 42 can be any dielectric layer, especially those described for the first ILD layer.

Figure 4:
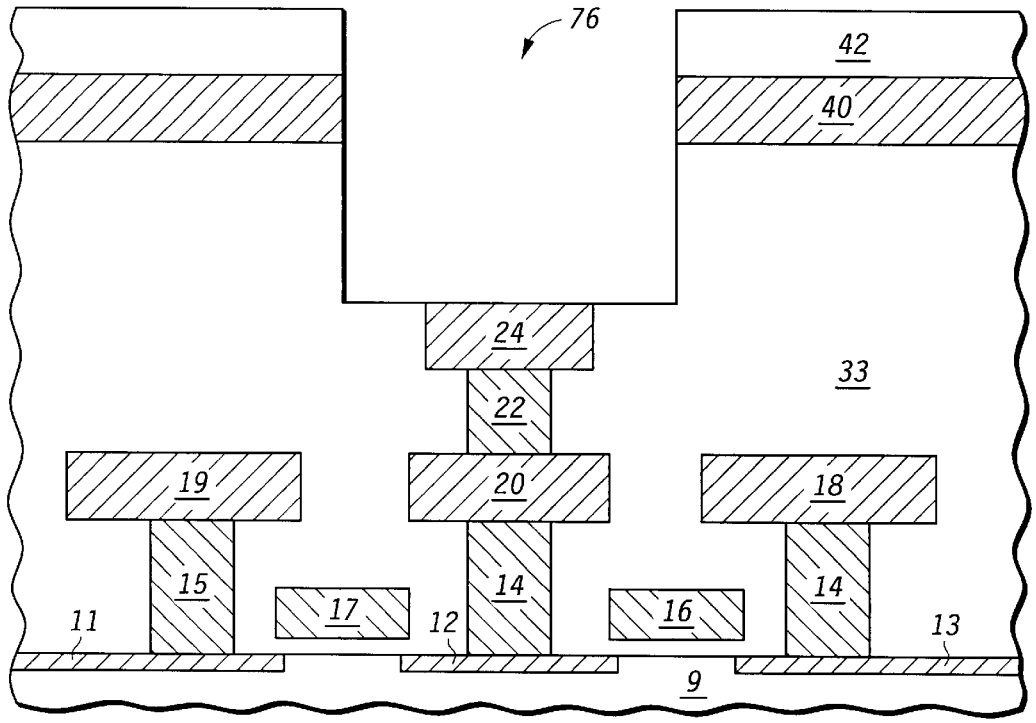

As shown in FIG. 4, the substrate surface is patterned and etched using conventional processes to define a recess 76. More specifically, the first dielectric layer 33, the bit line 40 and the second dielectric layer 42 are etched. Hence, the etch process uses a three step etch process that etches the three layers so that the recess 76 exposes the second conductive layer pad 24. To etch the first dielectric layer 33 and the second dielectric layer 42, a fluorine-containing chemistry can be used, especially if they are silicon dioxide. If the bit line 40 is copper, a chlorine-containing chemistry may be used to etch it.

After forming the recess 76, a first magnetic material is deposited overlying the substrate surface using PVD, ion beam deposition (IBD), CVD, the like or combinations thereof. The first magnetic material can be NiFe, CoFe, NiFeCo, and the like. Multilayer stacks such as a nonmagnetic or antiferromagnetic layers sandwiched between two magnetic layers with opposite magnetization vectors also can be used.

Figure 5:
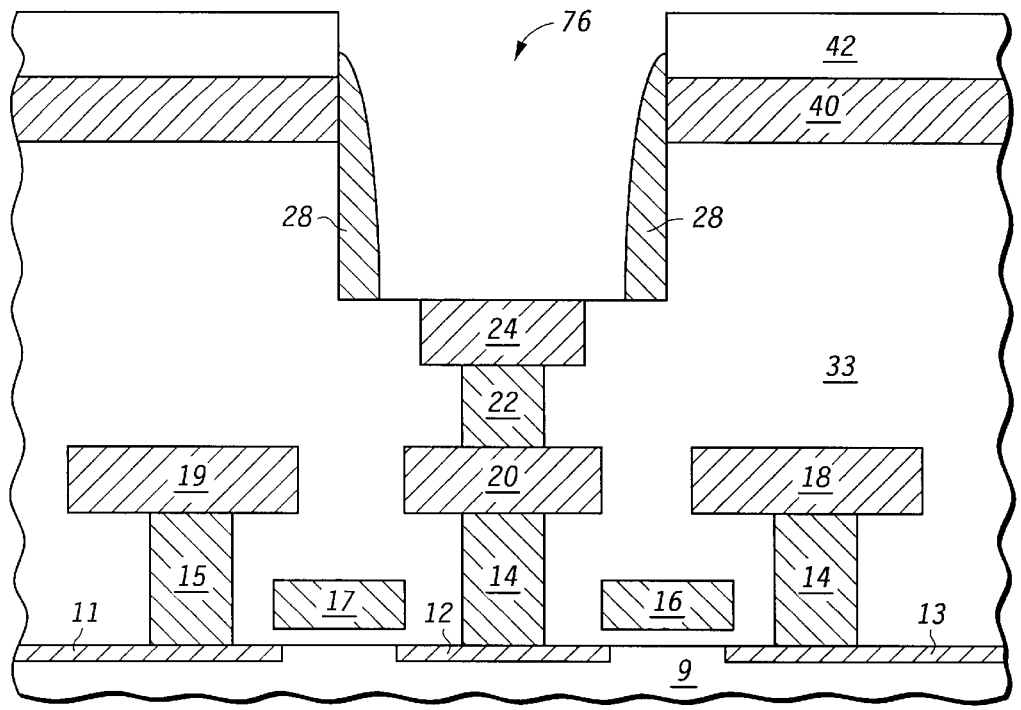

In one embodiment, the first magnetic material is anisotropically etched after being deposited, as shown in FIG. 5.

If the magnetic material is NiFe, a plasma etch including a chlorine-containing chemistry can be used. Alternatively, a chemical.mechanical.polish CMP process can be used to planarize the first magnetic material. The first magnetic material is the fixed magnetic layer 28 of the MRAM sandwich being formed in the recess 76 and is typically 2–20 nanometers in thickness. If an anisotropic etch is performed, the top of the fixed magnetic layer 28 will have a slope to it as shown in FIGS. 5–8 and if CMP is performed, the fixed magnetic layer 28 after CMP will resemble its shape in FIG. 1. The same holds true for the third dielectric layer 30, the free magnetic layer 24 and the optional dielectric layer 32, which will be formed in processes discussed below.

After forming the fixed magnetic layer 28, the third dielectric layer 30 and a second magnetic memory material are deposited using PVD, ion beam deposition (IBD), CVD, the like, or combinations thereof. The second magnetic memory material can be NiFe, CoFe, NiFeCo, and the like. Multilayer stacks (for example, of CoFe with NiFe) also can be used.

The third dielectric layer 30 may be aluminum oxide ($Al_2O_3$). In one embodiment, the third dielectric layer 30 is formed by first depositing an aluminum film over the semiconductor substrate and then oxidizing the aluminum film using an oxidation source, such as an RF oxygen plasma. Alternatively, aluminum oxide is deposited on the semiconductor substrate that may then be followed by a subsequent process in a heated or unheated oxygen ambient to ensure complete oxidation of the aluminum.

Figure 6:
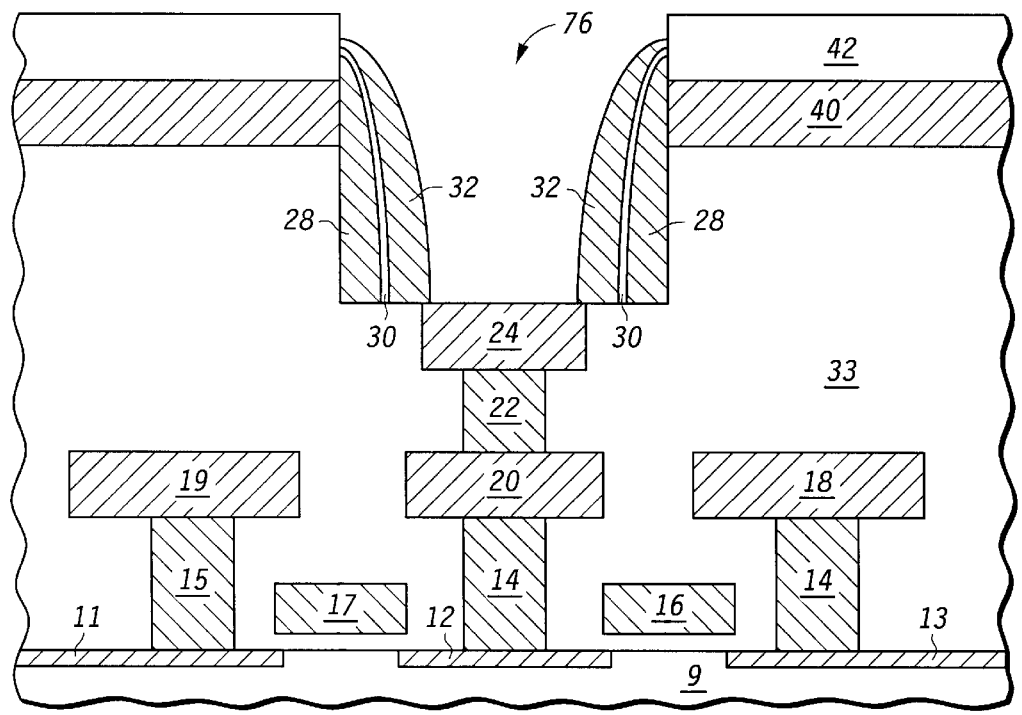

As shown in FIG. 6, the second magnetic material and the dielectric layer, in one embodiment, are anisotropically etched. If the dielectric layer is aluminum oxide, a plasma etch using a chlorine-containing chemistry may be used and if the second magnetic material is NiFe, a plasma etch using a chlorine-containing chemistry may be used. Preferably, the dielectric layer and the second magnetic material are deposited and then etched either in a two-step or one-step etch process. This can be performed because the dielectric layer is thin. Therefore, the etch chemistry used to etch the second magnetic material may inadvertently etch the dielectric layer and, therefore, only a one-step etch process may be needed instead of a two-step process. Furthermore, it is not important that all of the dielectric layer be removed from areas over the second dielectric layer 32 since the second dielectric layer 32 is also a dielectric material. Alternatively, the dielectric layer can be deposited and then etched or polished and then the second magnetic material can be deposited and then polished, but this is less desirable because is may increase the number of process steps and/or cycle time. In another embodiment, the third dielectric layer 30 and the second magnetic material are planarized using CMP. The second magnetic material is the free magnetic layer 32 and is preferably 2–20 nanometers in thickness. The fixed magnetic layer can use a magnetic material with a higher coercive field than that of the free magnetic layer material. Alternatively, geometrical effects such as thickness or length-to-width aspect ratios can be used to make the free magnetic layer easier to switch than the fixed magnetic layer.

Figure 7:
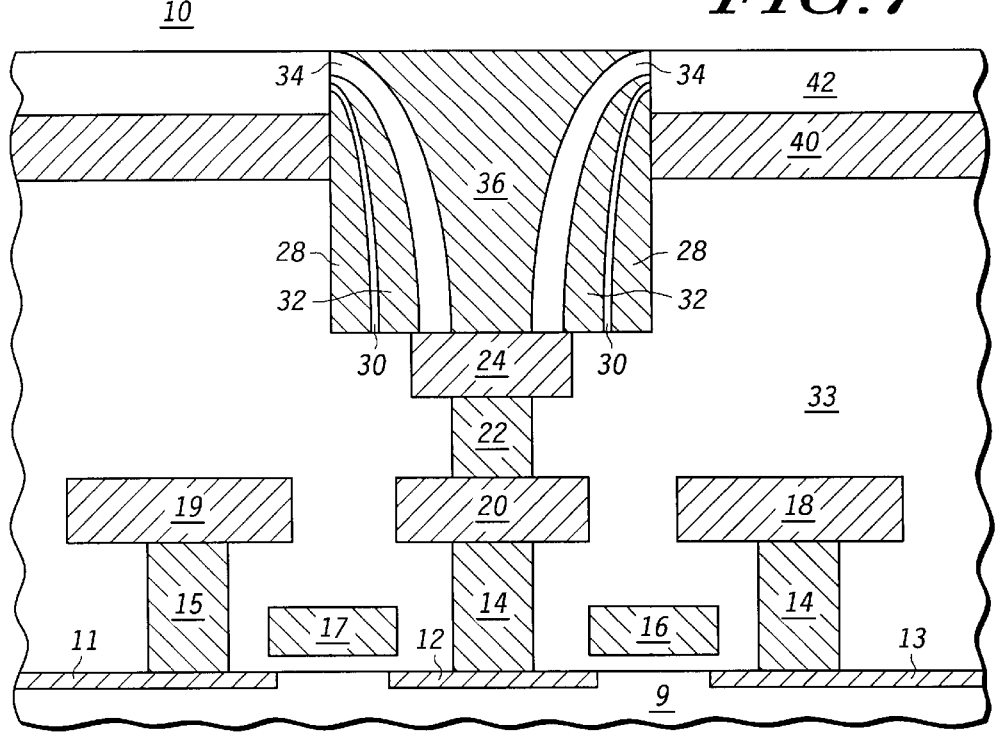

As shown in FIG. 7, after forming the free magnetic layer 32, a conductive material is deposited and planarized to completely fill the recess 76 and form the metal plug 36. The metal plug 36 can be any conductive material, such as copper, or stack of conductive materials formed by CVD, PVD, combinations of the above or the like. The conductive material can be planarized by using CMP or an etch back process.

Figure 8:
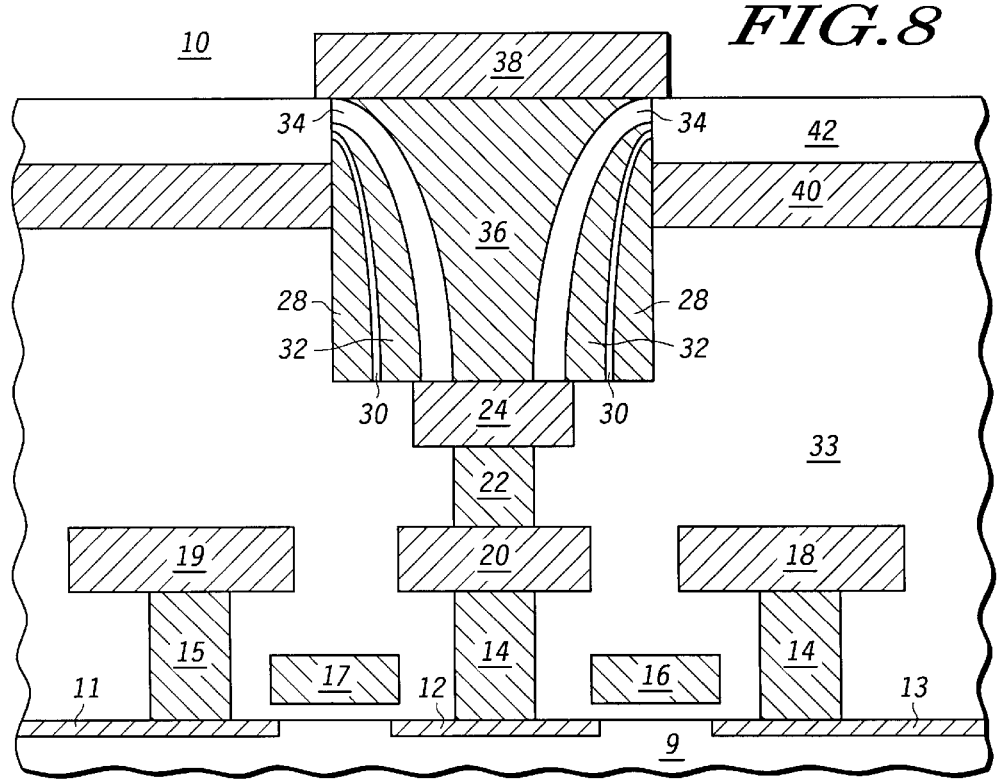

After filling the recess 76, a digit line 38 is formed over the MRAM sandwich 26 as illustrated in FIG. 8. The digit line 38 can be formed by depositing a conductive material and etching the conductive material. Alternatively, a dielectric layer, such as silicon dioxide, can be deposited and patterned to form a recess and the conductive material can be depositing using CVD, PVD, the like or combinations of the above in the recess to form the digit line 38. In one embodiment, the digit line is 400 nanometers of copper.

Unlike the prior art, during a write operation adjacent unselected MRAM cells are not written. Thus, data storage reliability is increased. Furthermore, the MRAM sandwich described herein is scalable and may be especially useful if the MRAM device size needed is small. In addition, the disclosed embodiments do not add new materials, which may be required difficult processing. Instead, the same materials as those used in the prior art can be used and the embodiments above can be achieved by changing design and processes.

In the foregoing specification, the invention has been described with reference to specific embodiments. However, one of ordinary skill in the art appreciates that various modifications and changes can be made without departing from the scope of the present invention as set forth in the claims below. A skilled artisan should recognize that when previously stated that the same material can be used for various layers, a skilled artisan should recognize that the same processes can also be used. In addition, a skilled artisan should understand that a layer can also be a structure. For example, the fixed magnetic layer is a fixed magnetic structure. Furthermore, one should recognize that circuit elements not described above, for example, input/output circuitry, data/address decoders, and comparators, may be contained in the MRAM device, however they are omitted from the drawings for simplicity. Accordingly, the specification and figures are to be regarded in an illustrative rather than restrictive sense, and all such modifications are intended to be included within the scope of the present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any of the claims.

What is claimed is:

1. A memory cell comprising:
   a fixed magnetic structure;
   a free magnetic structure;
   a dielectric structure located between the fixed magnetic structure and the free magnetic structure, wherein a resistance between the fixed magnetic structure and the free magnetic structure is indicative of a value stored in the memory cell;
   a write path structure having at least a portion located laterally to the free magnetic structure and positioned with respect to the free magnetic structure to provide a current path having a vertical component to carry current to change a direction of a magnetic field of the free magnetic structure.

2. The memory cell of claim 1 further comprising:
   a second dielectric structure located between the write path structure and the free magnetic structure.

3. The memory cell of claim 1 wherein:
   the write path structure is electrically coupled to a first conductive structure located over the free magnetic structure and to a second conductive structure located below the free magnetic structure to carry current between the first conductive structure and the second conductive structure.

4. The memory cell of claim 3 wherein the free magnetic structure is electrically coupled to the second conductive structure.

5. The memory cell of claim 1 wherein:
   the free magnetic structure surrounds at least a portion of the write path structure.

6. The memory cell of claim 5 further comprising:
   a second dielectric structure, the second dielectric surrounding at least a portion of the write path structure, wherein the free magnetic structure surrounds at least a portion of the second dielectric structure.

7. The memory cell of claim 5 wherein the dielectric structure surrounds at least a portion of the free magnetic structure and the fixed magnetic structure surrounds at least a portion of the dielectric structure, the dielectric structure electrically isolating the fixed magnetic structure from the free magnetic structure.

8. The memory cell of claim 1 wherein the write path structure is located in a recess having a top opening and a bottom surface, the write path structure extending at least from the top opening to at least the bottom surface, wherein the free magnetic structure is located within the recess.

9. The memory cell of claim 8 wherein the fixed magnetic structure is located within the recess.

10. The memory cell of claim 9 wherein an electrically conductive structure forms at least a portion of a side wall of the recess, the electrically conductive structure being electrically coupled to the fixed magnetic structure, the resistance between the fixed magnetic structure and the free magnetic structure is sensed through the electrically conductive structure.

11. The memory cell of claim 1 further comprising:
    a transistor having a first terminal electrically coupled to the write path structure, the transistor being made conductive to individually enable the flow of current through the write path structure.

12. The memory cell of claim 11 wherein the transistor includes a second terminal electrically coupled to ground structure, the transistor being made conductive to enable the flow of current between the write path structure and the ground structure.

13. The memory cell of claim 11 wherein a word line is electrically coupled to a control terminal of the transistor to control the conductivity of the transistor.

14. The memory cell of claim 1 wherein:
    the write path structure is located in a recess having a top opening and a bottom surface, the write path structure extending at least from the top opening to at least the bottom surface;
    the free magnetic structure is located within the recess, the free magnetic structure surrounds at least a portion of the write path structure;
    the dielectric structure is located in the recess, the dielectric structure surrounds at least a portion of the free magnetic structure;
    the fixed magnetic structure is located within the recess, the fixed magnetic structure surrounds at least a portion of the dielectric structure, the dielectric structure electrically isolating the fixed magnetic structure from the free magnetic structure;
    a conductive structure forms at least portion of a side wall of the recess, the conductive structure being electrically coupled to the fixed magnetic structure.

15. A memory device comprising a plurality of memory cells of claim 1.

16. A method for making a memory cell, the method comprising:
   forming a fixed magnetic structure of the memory cell;
   forming a free magnetic structure of the memory cell;
   forming a dielectric structure of the memory cell located between the fixed magnetic structure and the free magnetic structure, wherein a resistance between the fixed magnetic structure and the free magnetic structure is indicative of a value stored in the memory cell;
   forming a write path structure having at least a portion located laterally to the free magnetic structure and positioned with respect to the free magnetic structure to provide a current path having a vertical component to carry current to change a direction of a magnetic field of the free magnetic structure.

17. The method of claim 16 further comprising:
   forming a first conductive structure located below the free magnetic structure and the write path structure;
   forming a second conductive structure located above the free magnetic structure and the write path structure, wherein the write path structure is electrically coupled to the first conductive structure and the second conductive structure to carry current between the first conductive structure and the second conductive structure.

18. The method of claim 16 wherein the forming the write path structure further includes:
   removing material to form a recess;
   depositing a layer of conductive material including depositing the conductive material in the recess.

19. The method of claim 18 wherein forming the free magnetic structure further includes:
   depositing a layer of magnetic material including depositing the magnetic material in the recess prior to the forming the write path structure;
   removing material of the layer of magnetic material to leave the free magnetic structure located laterally of a side wall of the recess.

20. The method of claim 19 wherein the forming the fixed magnetic structure and the dielectric structure further includes:
   depositing a layer of magnetic material including depositing the magnetic material in the recess laterally to a sidewall of the recess prior to forming the free magnetic structure;
   removing material of the layer of magnetic material to leave the fixed magnetic structure located laterally to the sidewall of the recess;
   depositing a layer of dielectric material before the forming of the free magnetic structure and after the forming the fixed magnetic structure, the depositing including depositing the dielectric material in the recess laterally to the fixed magnetic structure;
   removing material of the layer of dielectric material to leave the dielectric structure located laterally to the fixed magnetic structure;
   wherein the free magnetic structure is located laterally to the dielectric structure.

21. The method of claim 20 further comprising:
   forming a second dielectric structure in the recess located laterally to the free magnetic structure after forming the free magnetic structure, the second dielectric structure located between the free magnetic structure and the write path structure.

22. The method of claim 20 wherein the free magnetic structure surrounds at least a portion of the write path structure, the dielectric structure surrounds at least a portion of the free magnetic structure, and the fixed magnetic structure surrounds at least a portion of the dielectric structure.

23. The method of claim 18 further comprising:
   forming a bit line of conductive material;
   wherein the material removed to form the recess includes conductive material of the bit line.

24. The method of claim 16 further comprising:
   forming a transistor having a first terminal and a second terminal, the first terminal is electrically coupled to the write path structure, the second terminal is electrically coupled to a ground structure.

25. A memory device comprising:
   a plurality of memory cells, each memory cell of the plurality including:
      a fixed magnetic structure;
      a free magnetic structure;
      a dielectric structure located between the fixed magnetic structure and the free magnetic structure, wherein a resistance between the fixed magnetic structure and the free magnetic structure is indicative of a value stored in the memory cell;
      a write path structure positioned with respect to the free magnetic structure to provide a current path to carry current to change a direction of a magnetic field of the free magnetic structure;
      a transistor having a first terminal electrically coupled to the write path structure, the transistor being made conductive to enable the flow of current through the write path structure.

26. The memory of device of claim 25 wherein for each memory cell of the plurality, at least a portion of the write path structure is located adjacent to the free magnetic structure and positioned with respect to the free magnetic structure to provide the magnetization path with a vertical component to carry the current to change the direction of the magnetic field of the free magnetic structure.

27. The memory device of claim 25 wherein for each memory cell of the plurality, the free magnetic structure is electrically coupled to the first terminal of the transistor, and the transistor is made conductive to enable the sensing of the resistance between the fixed magnetic structure and the free magnetic structure.

28. The memory device of claim 25 further comprising:
   a bit line electrically coupled to the fixed magnetic structures of each of a subset of memory cells of the plurality of memory cells, the resistance between the fixed magnetic structure and the free magnetic structure of each memory cell of the subset is sensed through the bit line.

29. The memory device of claim 25 further comprising:
   a word line electrically coupled to a control terminal of each of a subset of memory cells of the plurality of memory cells, the word line carrying a voltage to make conductive the transistors of the subset.

30. The memory device of claim 25 wherein for each memory cell of the plurality, the transistor includes a second terminal electrically coupled to a ground structure.

31. The memory device of claim 25 further comprising:

a plurality of bit lines, each electrically coupled to the fixed magnetic structures of a line of memory cells of the plurality having a first direction;

a plurality of word lines, each electrically coupled to control terminals of the transistors of a line of memory cells of the plurality having a second direction perpendicular to the first direction.

32. The memory device of claim 31 wherein for each memory cell of the plurality, the resistance between the fixed magnetic structure and the free magnetic is sensed through the bit line electrically coupled to the fixed magnetic structure when the word line electrically coupled to the control terminal of the transistor has a voltage to make the transistor conductive.

* * * * *

UNITED STATES PATENT AND TRADEMARK OFFICE
CERTIFICATE OF CORRECTION

PATENT NO. : 6,621,730 B1
DATED : September 16, 2003
INVENTOR(S) : Lage et al.

It is certified that error appears in the above-identified patent and that said Letters Patent is hereby corrected as shown below:

Column 10,
Line 10, change "dielectric surrounding" to -- dielectric structure surrounding --

Column 14,
Line 3, change "magnetic is" to -- magnetic structure is --

Signed and Sealed this

Thirteenth Day of January, 2004

JON W. DUDAS
*Acting Director of the United States Patent and Trademark Office*